United States Patent
Taguchi

(10) Patent No.: US 9,681,591 B2
(45) Date of Patent: Jun. 13, 2017

(54) HEAT-RECEIVING DEVICE, COOLING DEVICE, AND ELECTRONIC DEVICE

(71) Applicant: FUJITSU LIMITED, Kawasaki-shi, Kanagawa (JP)

(72) Inventor: Jun Taguchi, Miura (JP)

(73) Assignee: FUJITSU LIMITED, Kawasaki-Shi (JP)

( * ) Notice: Subject to any disclaimer, the term of this patent is extended or adjusted under 35 U.S.C. 154(b) by 37 days.

(21) Appl. No.: 14/611,577

(22) Filed: Feb. 2, 2015

(65) Prior Publication Data

US 2015/0146376 A1   May 28, 2015

Related U.S. Application Data

(63) Continuation of application No. PCT/JP2012/070756, filed on Aug. 15, 2012.

(51) Int. Cl.
  *H05K 7/20* (2006.01)
  *H01L 23/473* (2006.01)
  *F28F 27/02* (2006.01)

(52) U.S. Cl.
  CPC ......... *H05K 7/20927* (2013.01); *F28F 27/02* (2013.01); *H01L 23/473* (2013.01); *H01L 2924/0002* (2013.01)

(58) Field of Classification Search
  CPC ... H01L 23/473; F28F 27/02; H05K 7/20327; H05K 7/20927

(Continued)

(56) References Cited

U.S. PATENT DOCUMENTS

| 5,406,807 A | 4/1995 | Ashiwake et al. |
| 8,081,478 B1 | 12/2011 | Drexler et al. |

(Continued)

FOREIGN PATENT DOCUMENTS

| JP | 1-123972 | 5/1989 |
| JP | 6-4179 | 1/1994 |

(Continued)

OTHER PUBLICATIONS

PCT International Search Report mailed on Sep. 11, 2012 in corresponding International Patent Application No. PCT/JP2012/070756.

(Continued)

*Primary Examiner* — Tuan T Dinh
*Assistant Examiner* — Mukund G Patel
(74) *Attorney, Agent, or Firm* — Staas & Halsey LLP

(57) ABSTRACT

A heat-receiving device includes: a first heat receiver into which a refrigerant flows, and that receives heat from a heat-generating part; and a second heat receiver into which the refrigerant discharged from the first heat receiver flows, and that receives heat from the heat-generating part or another heat-generating part; wherein the first heat receiver includes: a case; a flow path that includes first and second branch paths branch off from each other and are joined again, that is provided within the case, and through which the refrigerant flows; and a thermostat that is provided in the first branch path, and that reduces a flow rate of the refrigerant flowing through the first branch path as a temperature of the refrigerant flowing through the first branch path decreases.

8 Claims, 6 Drawing Sheets

(58) Field of Classification Search
USPC .......... 165/96, 100, 139; 700/242, 282, 300
See application file for complete search history.

(56) References Cited

U.S. PATENT DOCUMENTS

| | | |
|---|---|---|
| 2003/0178176 A1 | 9/2003 | Jenkins et al. |
| 2005/0230080 A1 | 10/2005 | Paul et al. |
| 2009/0126910 A1* | 5/2009 | Campbell .......... H05K 7/20781 |
| | | 165/104.33 |
| 2009/0200007 A1* | 8/2009 | Foy .................. F28F 27/02 |
| | | 165/287 |
| 2011/0110043 A1 | 5/2011 | Iijima |

FOREIGN PATENT DOCUMENTS

| | | |
|---|---|---|
| JP | 2001-35981 | 2/2001 |
| JP | 2006-179771 | 7/2006 |
| JP | 2007-533170 | 11/2007 |
| JP | 2008-205087 | 9/2008 |
| JP | 2009-75801 | 4/2009 |
| JP | 2011-103102 | 5/2011 |
| JP | 2012-99694 | 5/2012 |

OTHER PUBLICATIONS

Written Opinion of the International Searching Authority mailed Sep. 11, 2012 in corresponding International Application No. PCT/JP2012/070756.

Japanese Office Action dated Mar. 8, 2016 in corresponding Japanese Patent Application No. 2014-530416.

* cited by examiner

HEAT-RECEIVING DEVICE, COOLING DEVICE, AND ELECTRONIC DEVICE

CROSS-REFERENCE TO RELATED APPLICATIONS

This application is a continuation application of PCT/JP2012/070756 filed on Aug. 15, 2012 and designated the U.S., the entire contents of which are incorporated herein by reference.

FIELD

The embodiments discussed herein are related to a heat-receiving device, a cooling device, and an electronic device.

BACKGROUND

In some cases, plural heat receivers are arranged in series on a path through which a refrigerant flows. Such a heat receiver into which the refrigerant flows receives heat from a heat-generating part. A technique related to such a heat receiver is disclosed in Japanese Patent Application Publication Nos. 06-04179, 2001-35981, and 2009-75801.

The refrigerant discharged from the heat receiver on the upstream side flows into the heat receiver on the downstream side. Therefore, the refrigerant that has already received heat from the heat receiver on the upstream side flows into the heat receiver on the downstream side. Thus, as compared with the heat receiving efficiency of the heat receiver on the upstream side, the heat receiving efficiency of the heat receiver on the downstream side might be low. In such a way, there might be variations in the heat receiving efficiency between the heat receivers.

SUMMARY

According to an aspect of the embodiments, a heat-receiving device includes: a first heat receiver into which a refrigerant flows, and that receives heat from a heat-generating part; and a second heat receiver into which the refrigerant discharged from the first heat receiver flows, and that receives heat from the heat-generating part or another heat-generating part; wherein the first heat receiver includes: a case; a flow path that includes first and second branch paths branch off from each other and are joined again, that is provided within the case, and through which the refrigerant flows; and a thermostat that is provided in the first branch path, and that reduces a flow rate of the refrigerant flowing through the first branch path as a temperature of the refrigerant flowing through the first branch path decreases.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
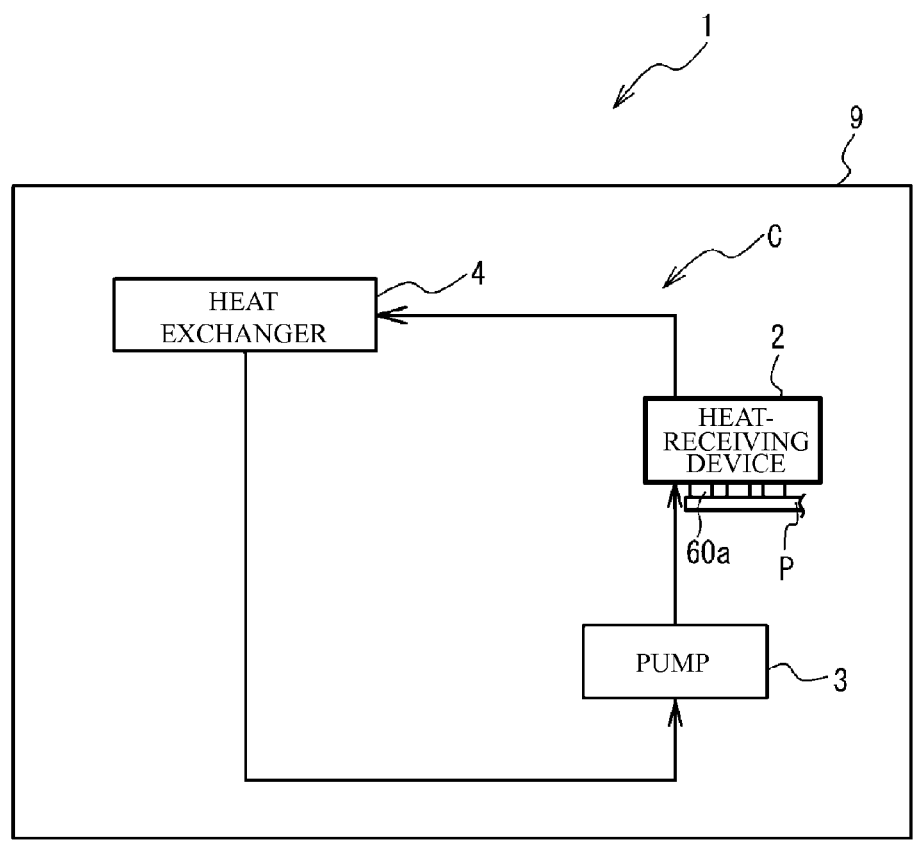
FIG. 1 is a block diagram of an electronic device.

FIG. 1 is a block diagram of an electronic device 1. The electronic device 1 is an information processing device such as a super computer, a server, a network device, a desktop computer, or a notebook computer. The electronic device 1 includes a cooling device C for cooling heat-generating parts to be described later, and a housing 9 housing the cooling device C.

The cooling device C includes a heat-receiving device 2, a pump 3, a heat exchanger 4, a heat-generating part 60a and the others, and a printed circuit board P. A refrigerant circulates through the cooling system C. The heat-receiving device 2 is provided in contact with the heat-generating part 60a and the others, and transfers heat from the heat-generating parts to the refrigerant. The pump 3 causes the refrigerant to circulate through the heat-receiving device 2 and the heat exchanger 4, in this order. The heat exchanger 4 dissipates heat from the refrigerant to the outside. The heat exchanger 4 may be any one of air-cooled type or a water-cooled type. In a case where the heat exchanger 4 is the air-cooled type, a fan may be provided for cooling the heat exchanger 4. The devices are connected through pipes made of metal and through flexible hoses. The refrigerant is, for example, antifreeze of propylene glycol, but is not limited thereto.

The heat-generating part 60a and the others are, for example, electronic parts such as CPUs or LSIs. The heat-generating part 60a and the others may be plural electronic parts arranged within a single package, or may be single semiconductor chips. The heat-generating part 60a and the others may be any one of parts that generate heat by electric power. The heat-generating part 60a and the others are mounted on the printed circuit board P.

Figure 2:
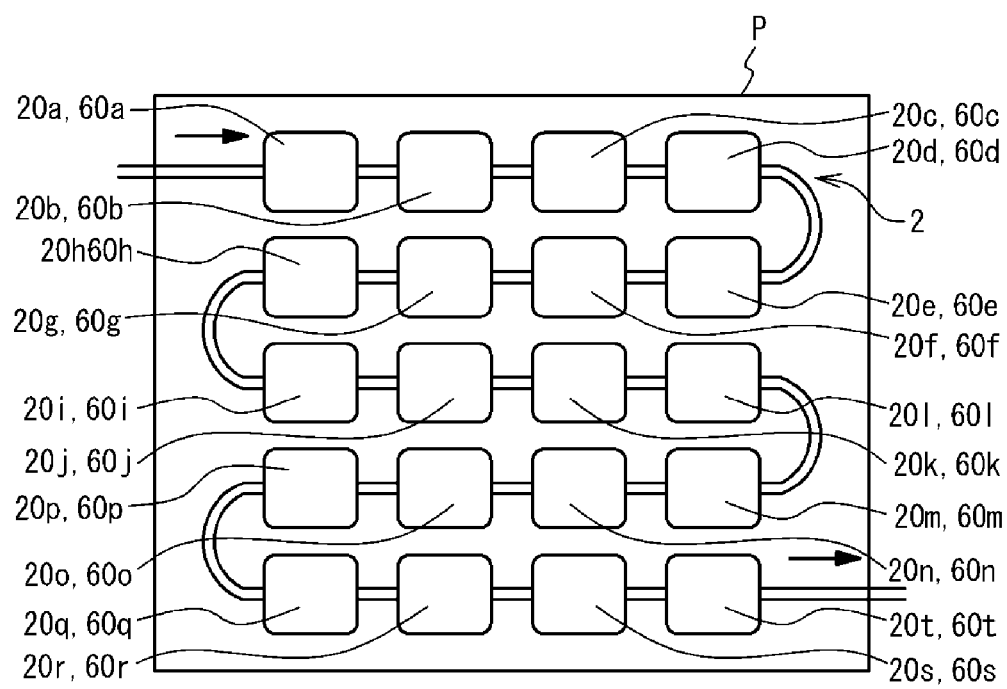
FIG. 2 is an explanatory view of a heat-receiving device.

FIG. 2 is an explanatory view of the heat-receiving device 2. The heat-receiving device 2 includes plural heat receivers 20a to 20t. The heat receivers 20a to 20t are arranged, on the path through which the refrigerant flows, in series from the upstream side to the downstream side. On the printed circuit board P, the plural heat-generating parts 60a to 60t are mounted. The heat receivers 20a to 20t respectively correspond to the heat-generating parts 60a to 60t. The heat receivers 20a to 20t respectively cool the heat-generating parts 60a to 60t.

Figure 3:
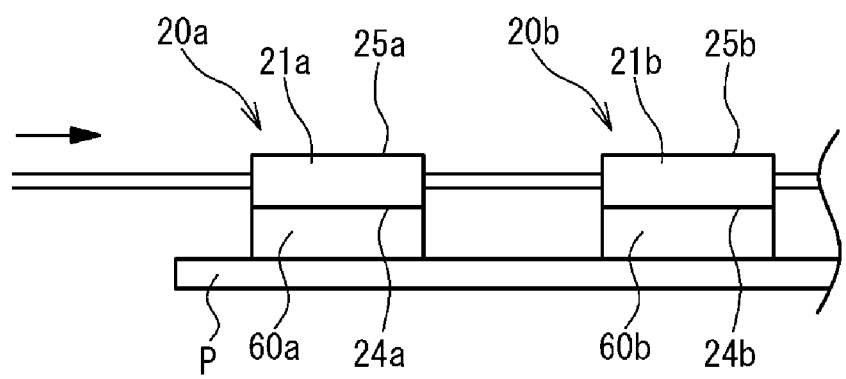
FIG. 3 is a side view partially illustrating the heat-receiving device.

FIG. 3 is a side view partially illustrating the heat-receiving device 2. The heat receivers 20a and 20b are respectively arranged on the heat-generating parts 60a and 60b. The refrigerant flows into the heat receivers 20a and 20b, and the heat receivers 20a and 20b respectively receive heat from the heat-generating parts 60a and 60b, thereby cooling the heat-generating parts 60a and 60b. Also, these arrangements are applicable to the other heat-generating parts 60c to 60t, and the other heat receivers 20c to 20t. The heat receivers 20a and 20b respectively include cases 21a and 21b made of metal such as copper or aluminum. The cases 21a and 21b respectively includes heat-receiving walls 24a and 24b and upper walls 25a and 25b. The heat-receiving walls 24a and 24b respectively face the heat-generating parts 60a and 60b. The upper walls 25a and 25b face the heat-receiving walls 24a and 24b and are not in contact with the heat-generating parts 60a and 60b, respectively. These arrangements are applicable to the other heat receivers.

In such a case where the plural heat receivers are connected in series, the cooling efficiency of the heat receiver on the downstream side is reduced in general. This is because the refrigerant having already received heat from the heat receiver on the upstream side has a high temperature and this high-temperature refrigerant flows into the heat receiver on the downstream side. Therefore, the heat receiving efficiency of the heat receiver on the downstream side tends to be lower than that of the heat receiver on the upstream side. This might cause a variation in the heating efficiency among the heat receivers, so that the heat-generating part cooled by the heat receiver on the downstream side might not be sufficiently cooled. The heat receiver in the present embodiment has the following structure.

Figure 4A:
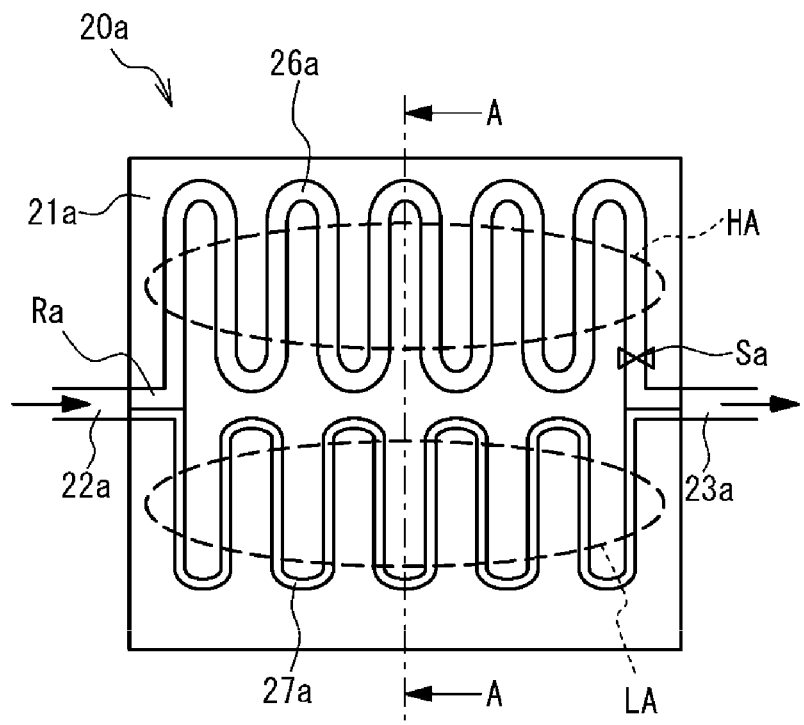
FIGS. 4A and 4B are explanatory views of a heat receiver in a present embodiment.
Figure 4B:
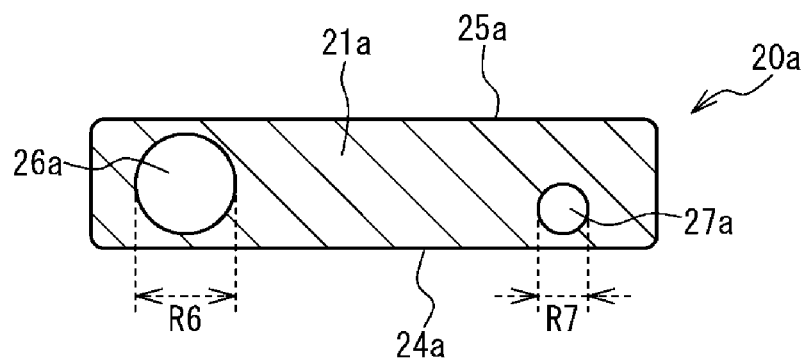

FIGS. 4A and 4B are explanatory views of the heat receiver 20a in the present embodiment. FIG. 4A is a perspective view of the heat receiver 20a. FIG. 4B is a sectional view taken along line A-A of FIG. 4A. As illustrated in FIG. 4A, a flow path Ra is formed within the case 21a. The flow path Ra includes branch paths 26a and 27a branching off from each other at the upstream side and being joined again at the downstream side. Nozzles 22a and 23a project outside from the case 21a. The nozzles 22a and 23a are respectively connected to the upstream side and the downstream side of the flow path Ra. An end of a tube is connected to the nozzle 22a and the other end of the tube is connected to the pump 3 side. An end of a tube is connected to the nozzle 23a and the other end of the tube is connected to a nozzle of the heat receiver 20b side adjacent to the heat receiver 20a side. The refrigerant flows from the nozzle 22a toward the nozzle 23a. Further, the heat-generating part 60a includes: a high temperature area HA that tends to have a comparatively high temperature; and a low temperature area LA that does not tend to have a comparatively high temperature. In FIG. 4A, the high temperature area HA and the low temperature area LA are superimposed over the heat receiver 20a.

The branch paths 26a and 27a are arranged in parallel and both of them meander. The branch paths 26a and 27a are an example of first and second branch paths. The branch path 26a is located on the high temperature area HA, and the branch path 27a is located on the low temperature area LA side. Each cross section of the branch paths 26a and 27a has a substantially circular shape. An internal diameter R6 of the branch path 26a is greater than an internal diameter R7 of the branch path 27a. Thus, the pipe surface area of the branch path 26a is greater than that of the branch path 27a. Further, when a thermostat is fully opened, a flow rate of the refrigerant flowing through the branch path 26a is greater than that of the refrigerant flowing through the branch path 27a. The branch path 26a is provided with a thermostat Sa on the downstream side. Specifically, the thermostat Sa is provided on the branch path 26a in the vicinity of the junction at which the branch paths 26a and 27a join each other again. In a predetermined temperature range, the thermostat Sa reduces a flow rate of the refrigerant flowing through a part of the branch path 26a where the thermostat Sa is arranged as a temperature of the refrigerant flowing through the part decreases. Additionally, these arrangements are applicable to the other heat receivers 20b to 20t. However, the present invention is not limited to these arrangements. At least one of the heat receivers 20a to 20t may have the structure illustrated in FIGS. 4A and 4B.

The thermostat Sa is, for example, a wax-pellet type, but may be another type. As for the wax-pellet type thermostat, wax is sealed within a pellet, and a valve is opened and closed by the expansion and contraction of the wax due to heat. It is desirable that the temperature at which the thermostat Sa fully opens is as high as possible within a range in consideration of a reduction in power consumption of the heat-generating part 60a, a reduction in failure rate, and the like.

When the heat-generating part 60a has a low temperature within a range in consideration of power consumption and a failure rate, the flow rate of the refrigerant flowing through the branch path 26a is reduced. The flow rate of the refrigerant flowing through the branch path 27a is increased by reducing the flow rate of the refrigerant flowing through the branch path 26a. The branch path 27a is arranged on the low temperature area LA, and the pipe surface area of the branch path 27a is smaller than that of the branch path 26a, thereby suppressing the heat receiving amount from the heat-generating part 60a. Therefore, the refrigerant discharged from the heat receiver 20a has a comparatively low temperature.

For example, it is supposed that a heat receiver is provided with two branch paths having the same shape and size within a case and is not provided with such a thermostat unlike the present embodiment. The flow rates of the refrigerant flowing through the respective two branch paths are substantially the same. For this reason, the flow rate of the refrigerant flowing through the branch path on the high temperature area is greater than that of the refrigerant flowing through the branch path 26a of the present embodiment. Therefore, the temperature of the refrigerant after flowing through such a heat receiver is greater than that of the refrigerant after flowing through the heat receiver 20a of the present embodiment. Thus, the high temperature refrigerant flows into a heat receiver located on the downstream side with respect to such a heat receiver, and the heat receiving efficiency of the downstream-side heat receiver might be reduced.

However, as for the heat receiver 20a in the present embodiment, the above mentioned structure can maintain the low temperature of the refrigerant after flowing through the heat receiver 20a. This can suppress the decrease in the heat receiving efficiency of the heat receiver on the downstream side with respect to the heat receiver 20a. Also, this can suppress the difference in heat receiving efficiency between the upstream-side heat receiver and the downstream-side heat receiver, and the heat-generating part located on the downstream side can be effectively cooled.

Additionally, the branch path 27a is located on the low temperature area LA side, but is not limited to this arrangement. Also, the heat receiver 20a and the heat-generating part 60a may have different sizes. For example, the heat-generating part 60a may be smaller than the heat receiver 20a, and the heat-generating part 60a may overlap only the branch path 26a of the heat receiver 20a.

Figure 5A:
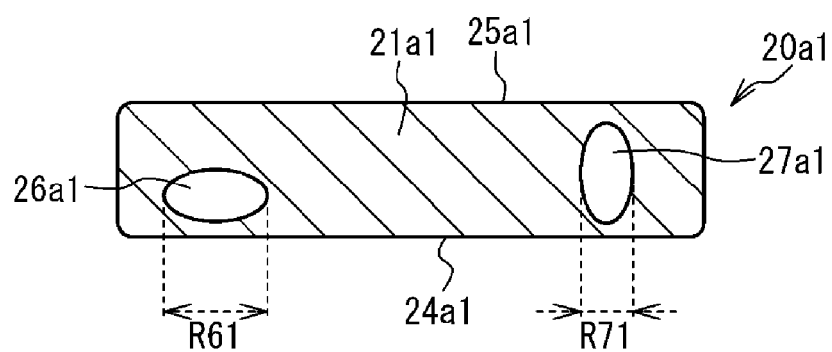
FIG. 5A is a sectional view of a heat receiver according to a first variation.

Next, a description will be given of plural variations in the heat receiver. Additionally, components similar to those of the above heat receiver are designated by the same reference numerals, and a duplicate description will be omitted. FIG. 5A is a sectional view of a heat receiver 20a1 according to a first variation. FIG. 5A corresponds to FIG. 4B. A case 21a1 includes a heat-receiving wall 24a1 and an upper wall 25a1. The heat-receiving wall 24a1 is an example of a wall portion. Each cross section of branch paths 26a1 and 27a1 has a substantially elliptical shape. An internal diameter R61 of the branch path 26a1 in the direction parallel with the heat-receiving wall 24a1 is greater than an internal diameter R71 of the branch path 27a1 in the direction parallel with the heat-receiving wall 24a1. Therefore, the heat receiving efficiency of the refrigerant flowing through the branch path 26a1 is ensured, and the heat receiving efficiency of the refrigerant flowing through the branch path 27a1 is suppressed. The surface areas of the branch paths 26a1 and 27a1 are the same, and the refrigerant flow rate are the same when the thermostat is fully opened. In addition, cross sections of the branch paths 26a1 and 27a1 are not limited to have an elliptical shape, and may have an oblong hole shape.

Figure 5B:
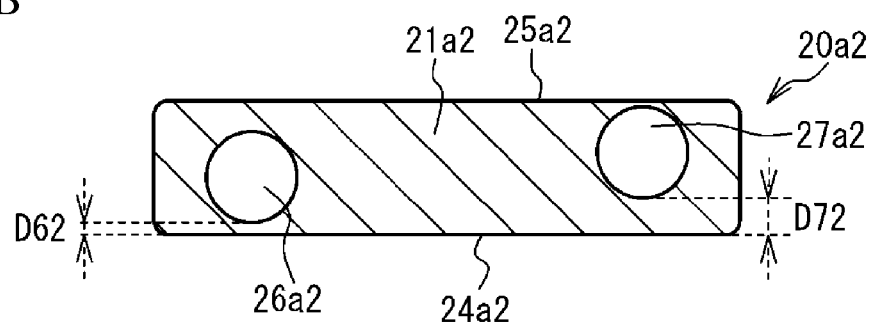
FIG. 5B is a sectional view of a heat receiver according to a second variation.

FIG. 5B is a sectional view of a heat receiver 20a2 according to a second variation. FIG. 5B corresponds to FIG. 4B. A case 21a2 includes a heat-receiving wall 24a2 and an upper wall 25a2. The heat-receiving wall 24a2 is an example of a wall portion. A distance D62 between a branch path 26a2 and the heat-receiving wall 24a2 is smaller than a distance D72 between a branch path 27a2 and the heat-receiving wall 24a2. That is, the branch path 26a2 is close to the heat-generating part 60a, and the branch path 27a2 is apart from the heat-generating part 60a. Therefore, the heat receiving efficiency of the refrigerant flowing through the branch path 26a2 is ensured, and the heat receiving efficiency of the refrigerant flowing through the branch path 27a2 is suppressed. In addition, as for the branch paths 26a2 and 27a2, the surface areas are substantially the same, the refrigerant flow rates are substantially the same when the thermostat is fully opened, and the cross sectional shapes are substantially the same. The cross sections of the branch paths 26a2 and 27a2 are not limited to have a circular shape, and may have, for example, an elliptical shape or an oblong hole shape. The surface area of the branch path 26a2 may be greater than that of the branch path 27a2. Further, the flow rate of the refrigerant flowing through the branch path 26a2 may be greater than that of the refrigerant flowing through the branch path 27a2, when the thermostat is fully opened.

Figure 6A:
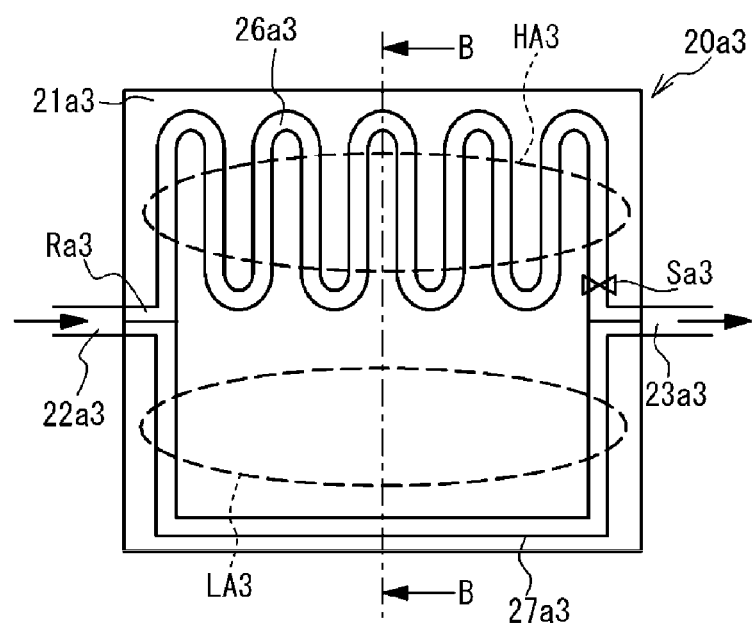
FIGS. 6A and 6B are explanatory views of a heat receiver according to a third variation.
Figure 6B:
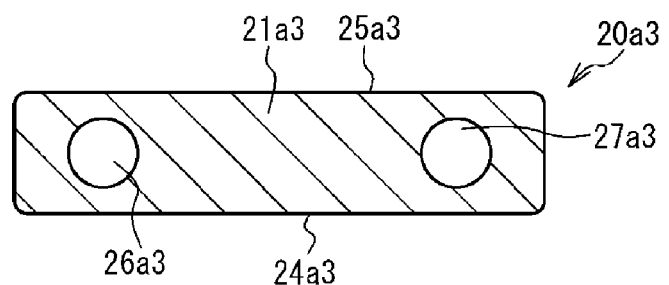

FIGS. 6A and 6B are explanatory views of a heat receiver 20a3 according to a third variation. FIG. 6A corresponds to FIG. 4A. FIG. 6B is a sectional view taken along line B-B of FIG. 6A. A case 21a3 includes a heat-receiving wall 24a3 and an upper wall 25a3. As illustrated in FIG. 6A, a flow path Ra3 includes branch paths 26a3 and 27a3. A nozzle 22a3 is connected to the upstream side of the flow path Ra3. A nozzle 23a3 is connected to the downstream side of the flow path Ra3. The branch path 26a3 is provided with a thermostat Sa3. The branch path 26a3 is located above the high temperature area HA of the case 21a3, whereas the branch path 27a3 is located at an edge apart from the heat-generating area of the case 21a3. Therefore, the heat receiving efficiency of the refrigerant flowing through the branch path 26a3 is ensured, and the heat receiving efficiency of the refrigerant flowing through the branch path 27a3 is suppressed.

In addition, the surface areas of the branch paths 26a3 and 27a3 are the same, and the refrigerant flow rate are the same when the thermostat is fully opened. The surface area of the branch path 26a3 may be greater than that of the branch path 27a3, and the flow rate of the refrigerant flowing through the branch path 26a3 may be greater than that of the refrigerant flowing through the branch path 27a3 when the thermostat is fully opened. The cross sections of the branch paths 26a3 and 27a3 are not limited to have a circular shape, and may have, for example, an elliptical shape or an oblong hole shape. Further, a distance between the branch path 26a3 and the heat-receiving wall 24a3 may be smaller than that between the branch path 27a3 and the heat-receiving wall 24a3.

Additionally, a single heat-generating part may be cooled by plural heat receivers. In this case, at least one of the plural heat receivers is the heat receiver described in the present embodiment.

Further, two branch paths provided in a single heat receiver may have the same shape and the same size, and one of the branch paths may be provided with a thermostat. Furthermore, in a case where three or more branch paths are provided in a single heat receiver, there may be at least one of the plural branch paths that is not provided with a thermostat.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A heat-receiving device comprising:
 a first heat receiver into which a refrigerant flows, and that receives heat from a heat-generating part which is mounted on a printed circuit board; and
 a second heat receiver into which the refrigerant discharged from the first heat receiver flows, and that receives heat from the heat-generating part or another heat-generating part,
 wherein the first heat receiver includes:
  a case;
  a flow path that includes first and second branch paths that branch off from each other and are joined again, that is provided within the case, and through which the refrigerant flows, and where the first and second branch paths overlap the heat generating part; and
  a thermostat that is provided in the first branch path, and that reduces a flow rate of the refrigerant flowing through the first branch path as a temperature of the refrigerant flowing through the first branch path decreases,
 a thermostat is not provided in the second branch path, and
 heat receiving efficiency of the refrigerant flowing through the first branch path is greater than that of the refrigerant flowing through the second branch path, when the thermostat is fully opened,
 wherein an internal diameter of the first branch path in a direction parallel with a wall portion of the case facing the heat-generating part is greater than that of the second branch path in the direction.

2. The heat-receiving device of claim 1, wherein a flow rate of the refrigerant flowing through the first branch path is greater than that of the refrigerant flowing through the second branch path, in a state where the thermostat is fully opened.

3. The heat-receiving device of claim 1, wherein a pipe surface area of the first branch path is greater than that of the second branch path.

4. The heat-receiving device of claim 1, wherein a distance between the first branch path and a wall portion of the case facing the heat-generating part is smaller than that between the second branch path and the wall portion.

5. A heat-receiving device comprising:
a heat receiver comprising:
   a case that receives heat from a heat-generating part which is mounted on a printed circuit board;
   a flow path that includes first and second branch paths that branch off from each other and are joined again, that is provided within the case, and through which the refrigerant flows, and where the first and second branch paths overlap the heat generating part; and
   a thermostat that is provided in the first branch path at a downstream side with respect to a center of a length of the first branch path, and that reduces a flow rate of the refrigerant flowing through the first branch path as a temperature of the refrigerant flowing through the first branch path decreases,
wherein a thermostat is not provided in the second branch path, and
heat receiving efficiency of the refrigerant flowing through the first branch path is greater than that of the refrigerant flowing through the second branch path, when the thermostat is fully opened,
wherein an internal diameter of the first branch path in a direction parallel with a wall portion of the case facing the heat-generating part is greater than that of the second branch path in the direction.

6. A cooling device comprising:
a heat-receiving device including:
   a first heat receiver into which a refrigerant flows, and that receives heat from a heat-generating part; and
   a second heat receiver into which the refrigerant discharged from the first heat receiver flows, and that receives heat from the heat-generating part or another heat-generating part;
a heat-generating part which is mounted on a printed circuit board; and
the printed circuit board,
wherein the first heat receiver includes:
   a case;
   a flow path that includes first and second branch paths that branch off from each other and are joined again, that is provided within the case, and through which the refrigerant flows, and where the first and second branch paths overlap the heat generating part; and
   a thermostat that is provided in the first branch path, and that reduces a flow rate of the refrigerant flowing through the first branch path as a temperature of the refrigerant flowing through the first branch path decreases,
a thermostat is not provided in the second branch path, and
heat receiving efficiency of the refrigerant flowing through the first branch path is greater than that of the refrigerant flowing through the second branch path, when the thermostat is fully opened,
wherein an internal diameter of the first branch path in a direction parallel with a wall portion of the case facing the heat-generating part is greater than that of the second branch path in the direction.

7. The cooling device of claim 6, comprising:
a heat exchanger that takes heat from the refrigerant; and
a pump that causes the refrigerant to circulate.

8. An electronic device comprising:
a heat-receiving device including:
   a first heat receiver into which a refrigerant flows, and that receives heat from a heat-generating part; and
   a second heat receiver into which the refrigerant discharged from the first heat receiver flows, and that receives heat from the heat-generating part or another heat-generating part;
a heat-generating part which is mounted on a printed circuit board;
the printed circuit board; and a housing that houses the heat-receiving device, the heat-generating part, and the printed circuit board,
wherein the first heat receiver includes:
   a case;
   a flow path that includes first and second branch paths that branch off from each other and are joined again, that is provided within the case, and through which the refrigerant flows, and where the first and second branch paths overlap the heat generating part; and
   a thermostat that is provided in the first branch path, and that reduces a flow rate of the refrigerant flowing through the first branch path as a temperature of the refrigerant flowing through the first branch path decreases,
a thermostat is not provided in the second branch path, and
heat receiving efficiency of the refrigerant flowing through the first branch path is greater than that of the refrigerant flowing through the second branch path, when the thermostat is fully opened,
wherein an internal diameter of the first branch path in a direction parallel with a wall portion of the case facing the heat-generating part is greater than that of the second branch path in the direction.

* * * * *